(12) United States Patent
Ikeda

(10) Patent No.: US 6,320,787 B1
(45) Date of Patent: Nov. 20, 2001

(54) NONVOLATILE MEMORY WITH ILLEGITIMATE READ PREVENTING CAPABILITY

(75) Inventor: Mitsutaka Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/572,319

(22) Filed: May 18, 2000

(30) Foreign Application Priority Data

Jun. 24, 1999 (JP) .................................................. 11-178615

(51) Int. Cl.[7] .................................................. G11C 16/04
(52) U.S. Cl. ...................................... 365/185.04; 365/194
(58) Field of Search ........................ 365/185.04, 185.01, 365/195, 189.01

(56) References Cited

U.S. PATENT DOCUMENTS 5,097,445 * 3/1992 Yamauchi ............................. 365/195
5,838,613 * 11/1998 Takizawa ......................... 365/185.04

FOREIGN PATENT DOCUMENTS 7-261942   10/1995  (JP) .
10-55315   2/1998   (JP) .

* cited by examiner

Primary Examiner—Hoai V. Ho
(74) Attorney, Agent, or Firm—Arent Fox Kintner Plotkin & Kahn, PLLC

(57) ABSTRACT

According to the present invention, access to a password area in a nonvolatile memory cannot be granted by simple supply of an address in a normal order. According to one preferable mode, for instance, a trap address is set in the password area so that reading information from the password area is permitted only when the password area is accessed without accessing the trap address, whereas when the password area is accessed through the trap address, information reading is inhibited, or meaningless data is output or the information in the password area is destroyed. According to another preferable mode, the order in which access is made to the password area can arbitrarily be set so that accessing the password area in this order alone can permit the password area to be read, whereas when access to the password area is made in a different order, information reading is inhibited, or meaningless data is output or the information in the password area is destroyed. According to both modes, while the recording medium where the trap address or accessing order information is stored is a nonvolatile memory, it is constructed in such a manner that writing and reading are both prohibited. This invention can make it harder to gain access to a password area which is used to protect against illegitimate copying and can provide a nonvolatile memory having a stronger copy protection capability.

4 Claims, 10 Drawing Sheets

FIG. 8A  Expected Address Information Add1, x

FIG. 8B  Expected Address EAdd

| EAdd | x | i |
|------|---|---|
| 5    | 4 | 0 |
| 6    | 3 | 0 |
| 7    | 2 | 0 |
| 8    | 1 | 0 |
| 0    | 4 | 1 |
| 1    | 3 | 1 |
| 2    | 2 | 1 |
| 3    | 1 | 1 |
| 10   | 3 | 2 |
| 11   | 2 | 2 |
| 12   | 1 | 2 |
| 4    | 1 | 3 |
| 13   | 3 | 4 |
| 14   | 2 | 4 |
| 15   | 1 | 4 |

NONVOLATILE MEMORY WITH ILLEGITIMATE READ PREVENTING CAPABILITY

BACKGROUND OF THE INVENTION

1. Field of the Invention

The present invention relates to a nonvolatile memory such as a flash memory, and, more particularly, to a nonvolatile memory which inhibits illegitimate reading of information from a predetermined area.

2. Description of the Related Art

Because of its capability to retain information even after powered off, nonvolatile memories, such as a flash memory, are widely used in portable telephones, portable information terminals, IC cards and so forth. This capability is used to record programs, predetermined data and parameters for achieving, for example, predetermined functions.

Information such as those programs and data itself has a property value so that its illegitimate readout and copy are undesirable. One way of preventing such illegitimate readout and copy, which has been proposed, is to provide a password area for recording a password in a nonvolatile memory and permits access to the main memory only when an externally given password matches with the recorded password.

FIG. 1 is a diagram showing how a conventional flash memory is used. A conventional flash memory 1 having an illegitimate-copy preventing capability has a password area 2 in addition to a main memory area 3. This password area 2 has, for example, a password PWA recorded therein and is write-protected in such a way that it is externally readable but unrewritable. That is, the password cannot be altered. A portable telephone 5 in which the flash memory 1 is installed allows an incorporated CPU 4 to read information from the password area 2 in the flash memory 1 and to gain access to the main memory area 3 in the flash memory 1 only when the read information coincides with the password PWA held in the CPU 4.

With the provision of this password area 2, even if a program A in the main memory area 3 is illegitimately copied into another flash memory 6, for example, the unauthentically copied program A cannot be read and used unless the password PWA is also copied into a password area 7 in the latter flash memory 6.

The following is the most typical example of the above case. Legitimate portable telephones 5 are available at a relatively low cost in country A, but the country code of country A is recorded in the program A, thus disabling their usage outside country A. By contrast, portable telephones are relatively expensive in country B, so that it is advantageous for users in country B if the portable telephones 5 obtained in country A can be used. In this case, one may attempt to replace the flash memory 1 in the authentic portable telephone 5 acquired in country A with another flash memory 6, illegitimately copy the program A in the latter flash memory 6 and rewrite the country code of country A in the flash memory with the country code of country B for unauthorized use. In other words, an unauthentic portable telephone 10 comes equipped with the flash memory 6 having the illegitimately copied program.

But, the program A cannot be read out and used unless the password PWA is acquired and is written in the password area 7 in the replaced flash memory 6. Because the address of the password area 2 in the authentic flash memory 1 is normally secret, it is generally difficult to access the password area 2 to acquire the password PWA.

While the password area 2 is write-protected and information there cannot be altered, it is not possible to inhibit read the information for password-based authentication. If one who wants to illegitimately copy the password attempts to read information from the password area a number of times while changing the address combination, he may be able to read the password PWA. After acquisition of the password PWA, this person can illegitimately copy the information (program A) in the free-accessible main memory area and use the unauthentic program A by copying the acquired password PWA in the password area 7.

The above is applied not only a program but also any information which should be subject to some kind of copyright protection. If password-based copy protection is applied to such information, therefore, once the password is acquired, nothing can stop the use of illegitimately copied information.

SUMMARY OF THE INVENTION

Accordingly, it is an object of the present invention to provide a nonvolatile memory capable of assuring more reliable protection against illegitimate copying.

It is another object of this invention to provide a nonvolatile memory having a password-based illegitimate copy protection capability, which can inhibit unauthentic access to a password.

To achieve the above objects, according to one aspect of the present invention, access to a password area in a nonvolatile memory cannot be granted by simple supply of an address in a normal order. According to one preferable mode, for instance, a trap address is set in the password area so that reading information from the password area is permitted only when the password area is accessed without accessing the trap address, whereas when the password area is accessed through the trap address, information reading is inhibited, or meaningless data is output or the information in the password area is destroyed. According to another preferable mode, the order in which access is made to the password area can arbitrarily be set so that accessing the password area in this order alone can permit the password area to be read, whereas when access to the password area is made in a different order, information reading is inhibited, or meaningless data is output or the information in the password area is destroyed. According to both modes, while the recording medium where the trap address or accessing order information is stored is a nonvolatile memory, it is constructed in such a manner that writing and reading are both prohibited.

This invention can make it harder to gain access to a password area which is used to protect against illegitimate copying and can provide a nonvolatile memory having a stronger copy protection capability.

To achieve the above objects, according to another aspect of this invention, there is provided a nonvolatile memory comprising: a password area where an authentication password for granting access to a main memory area is recorded; and a trap area which is provided in the password area and where the password is not recorded, wherein when access to the trap area is made at a time of accessing the password area, reading of information from the password area is inhibited.

To achieve the above objects, according to a further aspect of this invention, there is provided a nonvolatile memory having a password area where an authentication password for granting access to a main memory area is recorded; wherein a predetermined order of addresses is set for permitting access to the password area, and when the password area is accessed in an order different from the predetermined order of addresses, reading of information from the password area is inhibited.

DETAILED DESCRIPTION OF THE PREFERRED EMBODIMENTS

Preferred embodiments of the present invention will now be described referring to the accompanying drawings. It should however be apparent to those skilled in the art that those embodiments do not in any way restrict the technical scope of this invention. Those embodiments to be described below will be illustrated in the context of a flash memory which is one type of nonvolatile memories and which can perform predetermined operations, such as writing, erasing and reading, in response to input commands.

Figure 2:
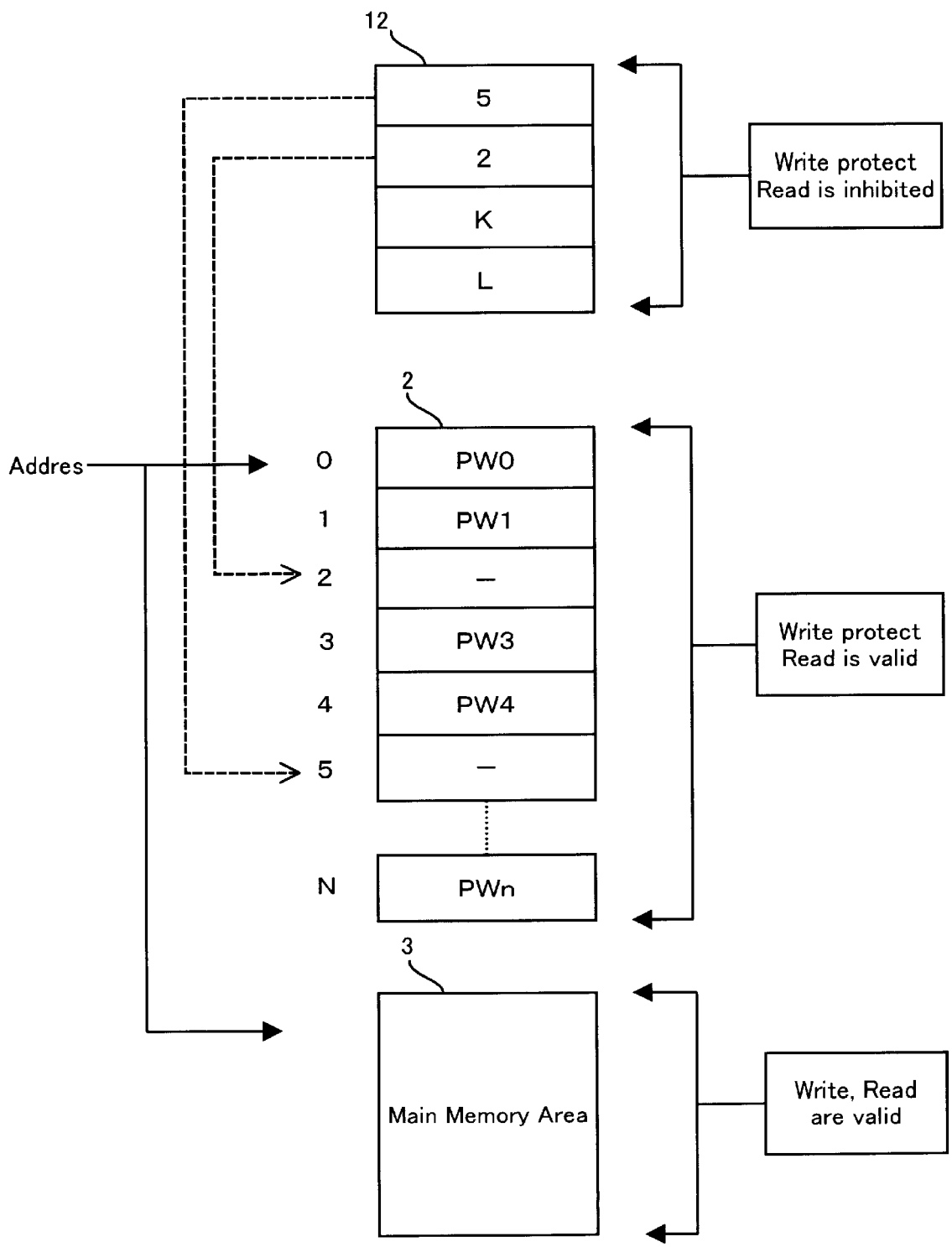
FIG. 2 is a diagram exemplifying a scheme of protecting illegitimate reading of a password according to a first embodiment of this invention.

FIG. 2 exemplifies how to protect illegitimate reading of a password according to the first embodiment. According to the first embodiment, a trap area where a password is not recorded is provided in a password area 2, so that when access to the trap area is made at the time of accessing the password area 2, reading of information from the password area 2 is inhibited. When access to the password area 2 is made without accessing the trap area, reading the password from the password area 2 is granted.

As shown in FIG. 2, the nonvolatile memory comprises a main memory area 3 which is rewritable and readable in an ordinary manner, and the password area 2 where a password for authentication of access to the main memory area 3 is recorded and which is write-protected. According to the nonvolatile memory of this embodiment, a manufacturer who manufactures portable telephones, predetermined IC cards or the like using a flash memory sets a predetermined address area in the password area 2 as a trap area. A trap address area 12 where the trap address is recorded and which is neither externally rewritable nor readable is provided in the nonvolatile memory.

Figure 1:
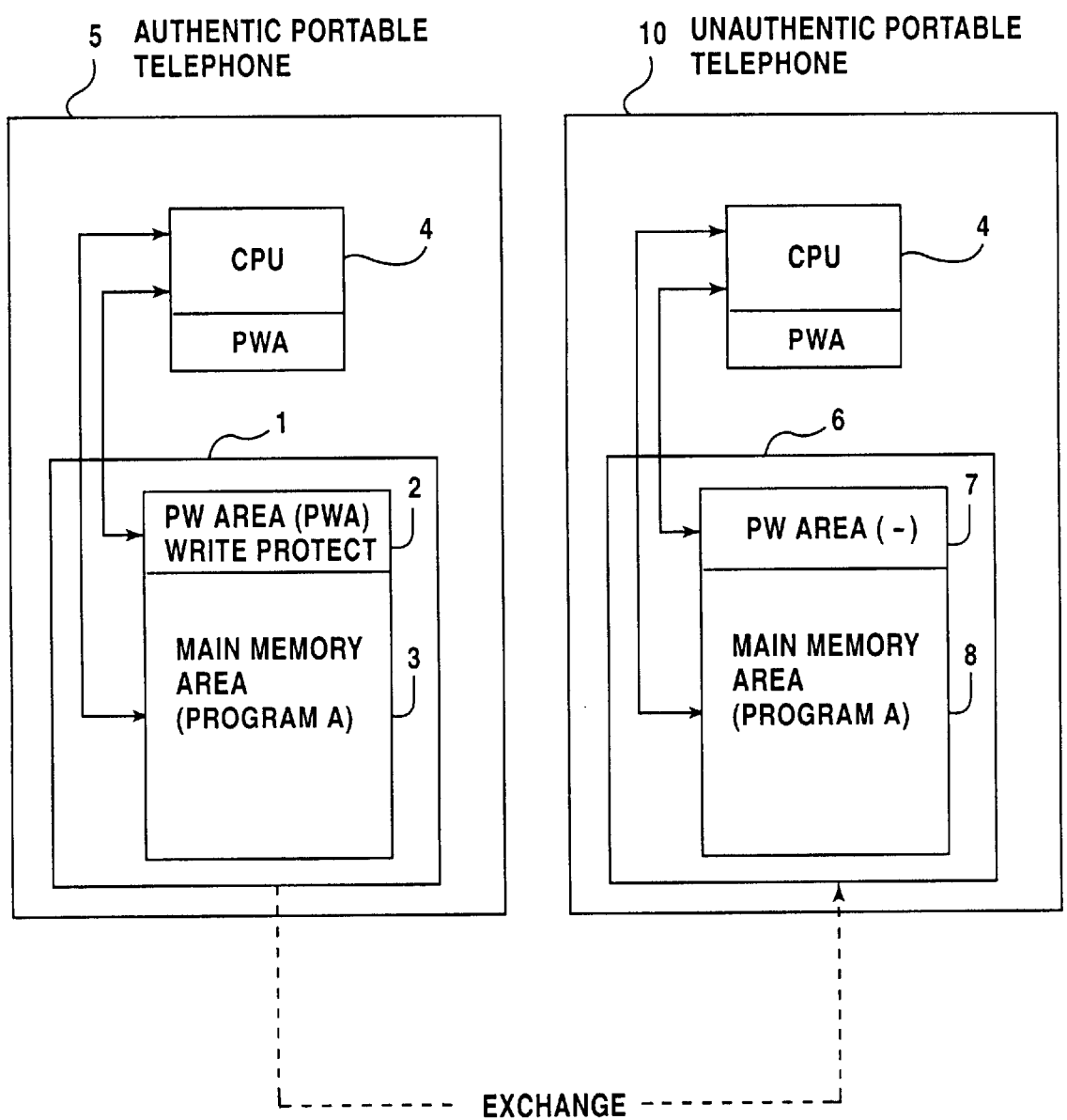
FIG. 1 is a diagram showing how a conventional nonvolatile memory is used.

In the example of FIG. 2, addresses 2, 5, K and L in the password area 2 are set as the trap address and recorded in the trap address area 12. Therefore, a valid password is recorded in an area other than the trap addresses 2, 5, K and L in the password area 2, not in the trap area of the trap address. In the example of FIG. 1, the set trap addresses are also stored in the CPU 4 so that at the time the CPU 4 accesses the password area in the flash memory, it can properly read the password recorded in the password area 2 in the flash memory by making the access without accessing those trap addresses.

The trap address area 12, like the password area 2, can be written only once by the user of the flash memory, and it is thereafter write-protected to prohibit alteration. Because, unlike the password area 2, the trap address area 12 is not provided with a circuit or function which allows this trap address area 12 to be externally read, there hardly is any chance of illegitimately reading the trap address area 12.

Figure 3:
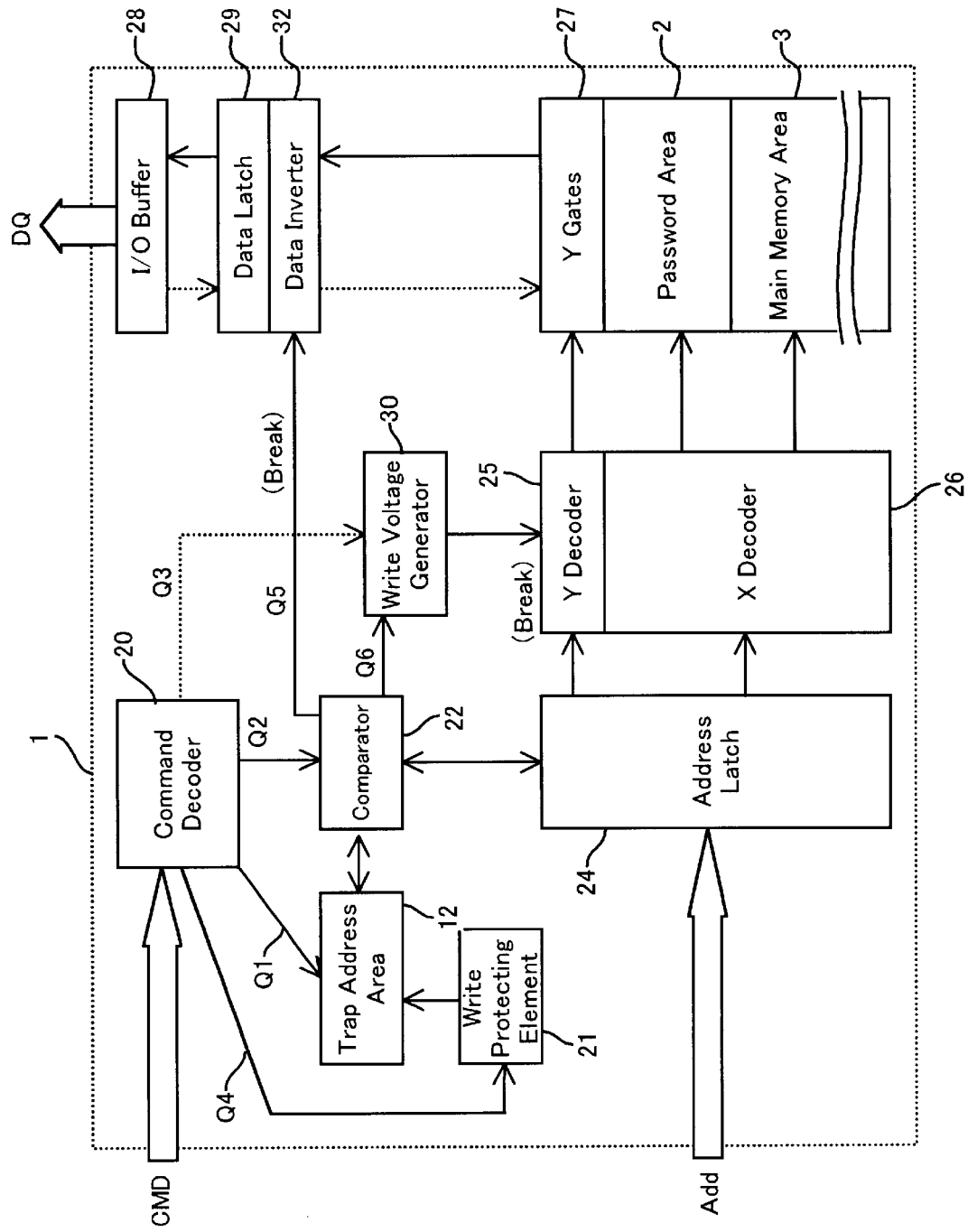
FIG. 3 a structural diagram of a nonvolatile memory according to the first embodiment.

FIG. 3 is a structural diagram of the nonvolatile memory according to the first embodiment. The flash memory in FIG. 3 has the password area 2 and the main memory area 3 each having a cell matrix. An address signal Add is latched by an address holding section 24 and is supplied to an X decoder 26 and a Y decoder 25. The X decoder 26 activates a word line which is selected in association with the address signal and the Y decoder 25 enables an Y gate 27 which is selected in association with the address signal. An input/output buffer 28, connected to a data input/output terminal DQ, outputs read data held in a data holding section 29 and receives write data to be input.

A command decoder 20 is supplied with a predetermined command CMD from an address terminal and data input/output terminal. The command decoder 20 decodes the supplied command and generates an internal control signal corresponding to the command. In association with a write command, for example, the command decoder 20 generates a write control signal Q3 to cause a write voltage generator 30 to generate a write voltage, thereby enabling writing to cells in the cell matrix.

As mentioned above, the flash memory 1 according to the first embodiment has the trap address area 12 to store the trap addresses. The flash memory 1 further comprises a comparator 22 which compares the stored trap addresses with the input address signal Add, and a write-protecting element 21 which write-protects the trap address area 12.

A person who designs portable telephones, IC cards or the like using the flash memory 1 first supplies a trap-address setting command to the command decoder 20 and writes the trap addresses in the trap address area 12 using a control signal Q1. After writing the trap addresses, the write-protecting element 21 is set in a write-protected state using a control signal Q4. This makes it impossible to externally rewrite the information in the trap address area 12. What is more, there is no circuit provided which allows the information in the trap address area 12 to be externally read out.

Information on the set trap addresses is also recorded in the CPU that attempts to access the flash memory 1. This information is not also readable from outside the CPU.

In an ordinary reading operation, first, the CPU supplies a read command for reading the password area 2 to the command decoder 20 and supplies the address of the password area 2 in such a way as to avoid the trap addresses to read the password. In response to the password-area read command, the command decoder 20 enables the comparator 22 by a control signal Q2. The comparator 22 then checks if the address signal supplied from the CPU coincides with the trap addresses. That is, the comparator 22 checks if the address latched in the address holding section 24 matches any one of the trap addresses in the trap address area 12.

When the comparator 22 detects a match, which implies the access being illegitimate, the comparator 22 generates a break signal Q5 or Q6. In response to the break signal Q5, a data inverting circuit 32 provided at the preceding stage of the data holding section 29 inverts the data read from the password area 2 and outputs the inverted data. In response to the break signal Q6, the write voltage generator 30 is enabled to destroy (erase or over write) the password in the password area 2. As a result, incorrect data is output as the password.

Figure 4:
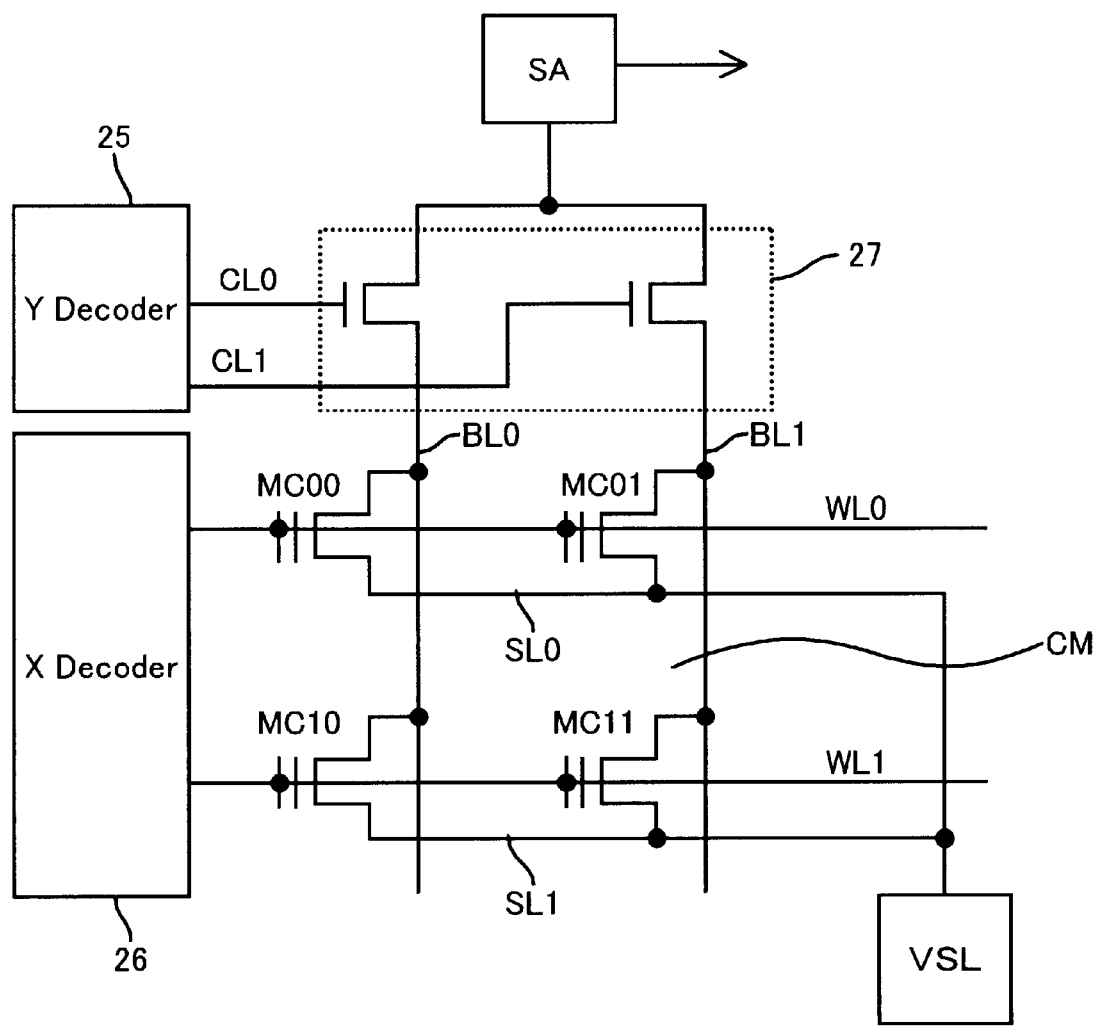
FIG. 4 is a diagram exemplifying the structure of a cell matrix.

FIG. 4 is a diagram exemplifying the structure of a cell matrix. A cell matrix CM has a plurality of word lines WL0, WL1, which are selected and activated to a predetermined voltage by the X decoder 26, a plurality of bit lines BL0, BL1 connected to the Y gate 27 which is selected and enabled by the Y decoder 25, and memory cells MC00 to MC11 having floating gates located at the intersections of the word lines and the bit lines. The sources of the memory cell transistors are connected to a common source line SL and their potentials are controlled by a source control circuit VSL. The source control circuit VSL is part of the write voltage generator 30 in FIG. 3.

The write voltage generator 30, though not shown in FIG. 4, programs (writes) data of "0" by, for example, activating a target word line to a high voltage, activates a target bit line to the power supply potential and sets the source line to the ground potential, thereby causing electrons to be injected into the floating gate of the target memory cell transistor. At the time of erasure, the target word line is set to the ground potential, the target bit line is set in a floating state and the source line is set to a high voltage, thereby draining the electrons from the target floating gate. This lowers the threshold voltage so that data of "1" is erased.

Figure 5:
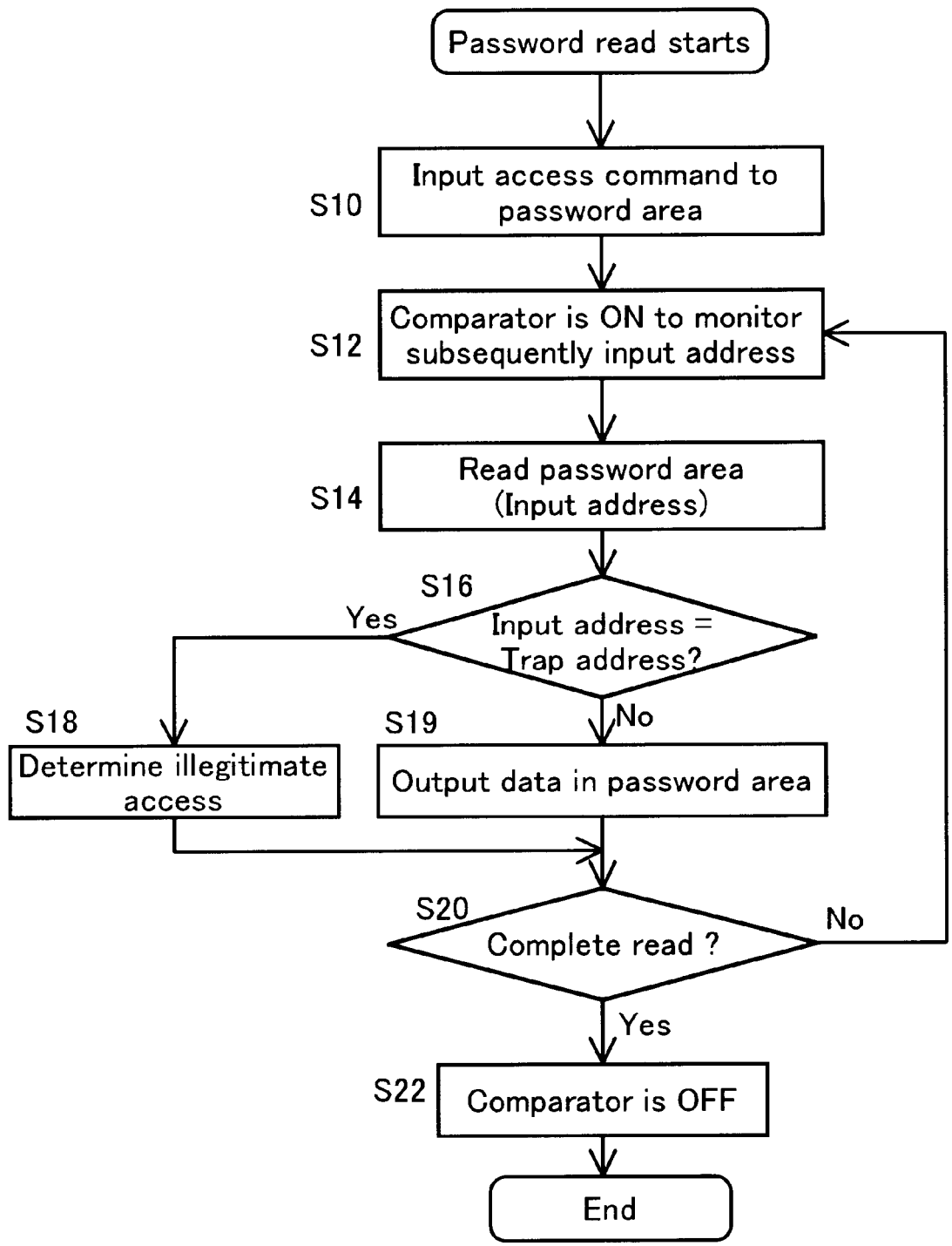
FIG. 5 is a flowchart illustrating a password reading operation according to the first embodiment.

FIG. 5 is a flowchart illustrating the password reading operation according to the first embodiment. The password reading operation is controlled by the command decoder 20 shown in FIG. 3. If the command decoder 20 is constructed by a microprocessor, a program which carries out the individual processes in the flowchart in FIG. 5 is stored in the command decoder 20.

The password reading operation will now be explained referring to FIG. 5. To initiate reading of the password, an access command to the password area 2 is input to the command decoder 20 (S10). The access command is identified by the command decoder 20 and the control signal Q2 enables the comparator 22 to monitor a subsequently input address (S12).

To read the password area 2, an address signal corresponding to the password area 2 is input from an address terminal Add and is latched in the address holding section 24 (S14). The comparator 22 checks if this input address coincides with the trap addresses stored in the trap address area 12 (S16). In this step, all the trap addresses in the trap address area 12 are compared with the input address and if any trap address matches with the input address, it is determined that illegitimate access is being made (S18). If every trap address does not match with the input address, data in the password area 2 corresponding to that address is correctly read out (S19).

Those steps S14 to S19 are repeated until reading the data from the password area 2 is completed. When readout is completed (S20), the comparator 22 is deactivated to stop further comparison. The completion of reading information from the password area 2 is normally detected by sending a command to read data from the main memory area 3 to the command decoder 20 after the external CPU authenticates that the read password is the right one.

When the comparator 22 detects a match between the input address and any trap address, it determines that illegitimate access is being made and outputs the break signal Q5 or Q6. Those break signals Q5 and Q6 cause the subsequent read data to be inverted by the data inverting circuit 32 or cause the write voltage generator 30 to erase data in the password area 2 to be accessed (destroy the data or set the data to "0"). This inhibits reading of the accurate password. When reading the password is prohibited as above, the flash memory which permits access to the main memory area 3 only on the condition that there is a password match prevents the information in the main memory area 3 from being illegitimately copied.

Only one of the data inversion by the break signal Q5 and the erasure (destruction) of data in the password area 2 by the break signal Q6 may be carried out or both may be executed as needed.

Figure 6:
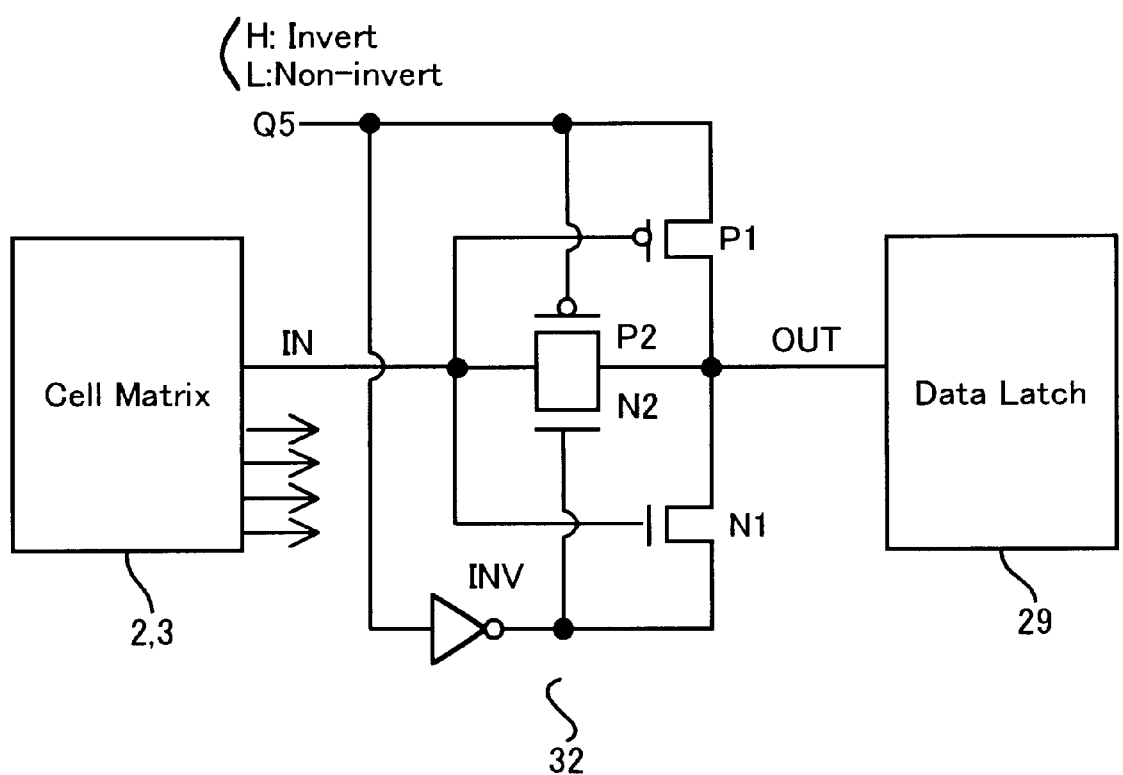
FIG. 6 is a diagram showing one example of a data inverting circuit.

FIG. 6 is a diagram showing one example of the data inverting circuit 32. When the break signal Q5 has an L level, a P type transistor P2 and N type transistor N2 are enabled so that data IN read from a cell matrix 2, 3 is output, uninverted, to the data holding section 29. When the break signal Q5 has an H level, on the other hand, the P type transistor P2 and N type transistor N2 are disabled so that a CMOS inverter comprised of a P type transistor P1 and N type transistor N1 becomes active. As a result, the read data IN is supplied, after inverted, to the data holding section 29.

The data inverting circuit 32 in FIG. 6 may be provided for every output from the cell matrix or may be provided only for an arbitrary output. In the latter case, it becomes more difficult to analyze the correct password.

Figure 7:
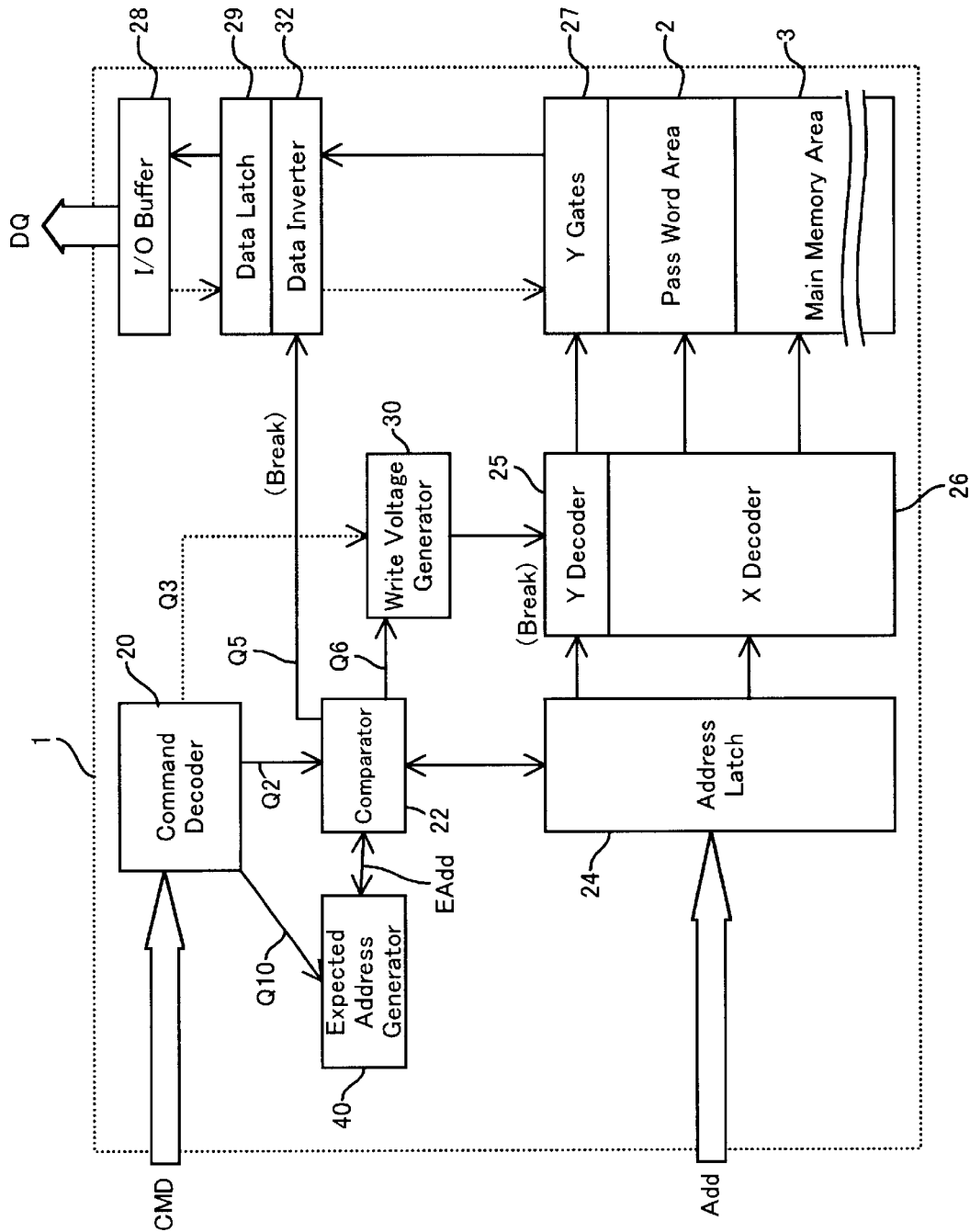
FIG. 7 is a structural diagram of a nonvolatile memory according to a second/embodiment of this invention.

FIG. 7 is a structural diagram of a nonvolatile memory according to the second embodiment of this invention. Like or same reference numerals are given to those components which are the same as the corresponding components of the first embodiment. According to the second embodiment, to prevent illegitimate reading of the password area 2, a predetermined order of addresses for permitting access to the password area is set so that when the password area 2 is accessed in an order different from the predetermined order of addresses, reading of the accurate information from the password area is inhibited. The inhibition of information reading is accomplished by, for example, inverting the read data by means of the data inverting circuit 32 or erasing (destroying) the data in the password area 2 using the write voltage generator 30 as per the first embodiment.

As shown in FIG. 7, this nonvolatile memory is provided with an expected-address generating section 40 which generates an expected address EAdd in a predetermined address order and the comparator 22 which compares the expected address EAdd generated by the expected-address generating section 40 with the input address Add. The second embodiment is otherwise the same as the first embodiment.

The expected-address generating section 40 has an area to store information about the set order of expected addresses, and this area, like the trap address area in the first embodiment, is write-protected once data is written there, thereby disabling later alteration of the data. The information about the address order is of course designed as being externally unreadable.

The information about the address order may be a sequence of address data or associated information based on which the expected address is generated. The latter case makes illegitimate reading harder. In either case, the information is called expected address information.

Figure 8:
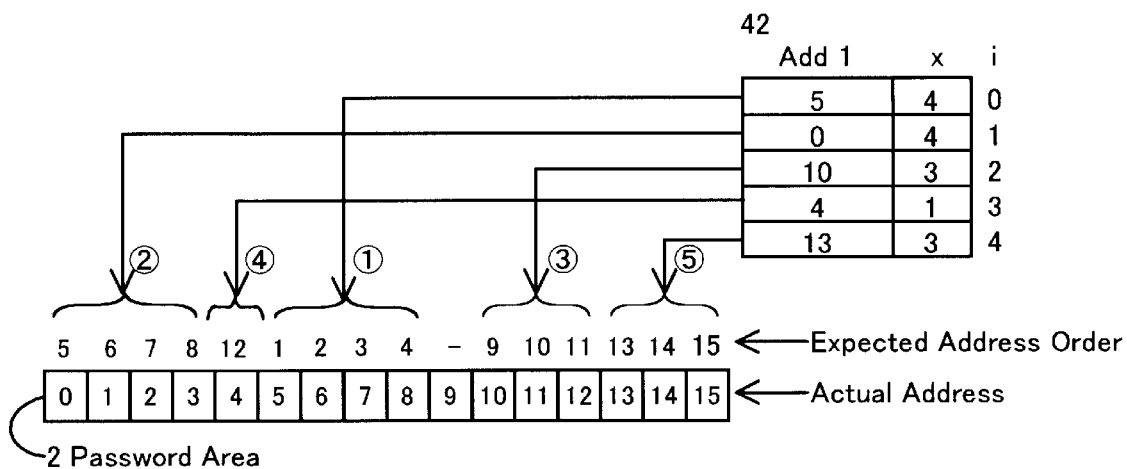
FIGS. 8A and 8B are diagrams exemplifying the relationship between expected address information and expected addresses.

FIGS. 8A and 8B are diagrams exemplifying the relationship between expected address information and expected addresses. In this example, as shown in FIG. 8A, an expected-address information area 42 has a start address value Add1 and a continuous value x as expected address information. Those two pieces of information are stored at addresses i=0 to 4.

The expected address information is read out in the order of addresses i, and expected addresses EAdd are generated by an unillustrated expected-address calculation section. FIG. 8B presents a table showing the expected addresses EAdd. At address i=0, for example, because the start address value Add1=5 and the continuous value x=4, the expected addresses EAdd become "5, 6, 7, 8". That is, the address is incremented from the start address value Add1 by the continuous value x. When the address is incremented by the continuous value x, expected address information at the next address i=1 is read and the expected addresses EAdd "0, 1, 2, 3" are produced in the same manner.

Likewise, the expected addresses become "10, 11, 12" for address i=2, become "4" for address i=3 and become "13, 14, 15" for address i=4.

The order of addresses for the authentic access to the password area 2 in this example is shown in the column of the expected addresses EAdd in FIG. 8B.

Figure 9:
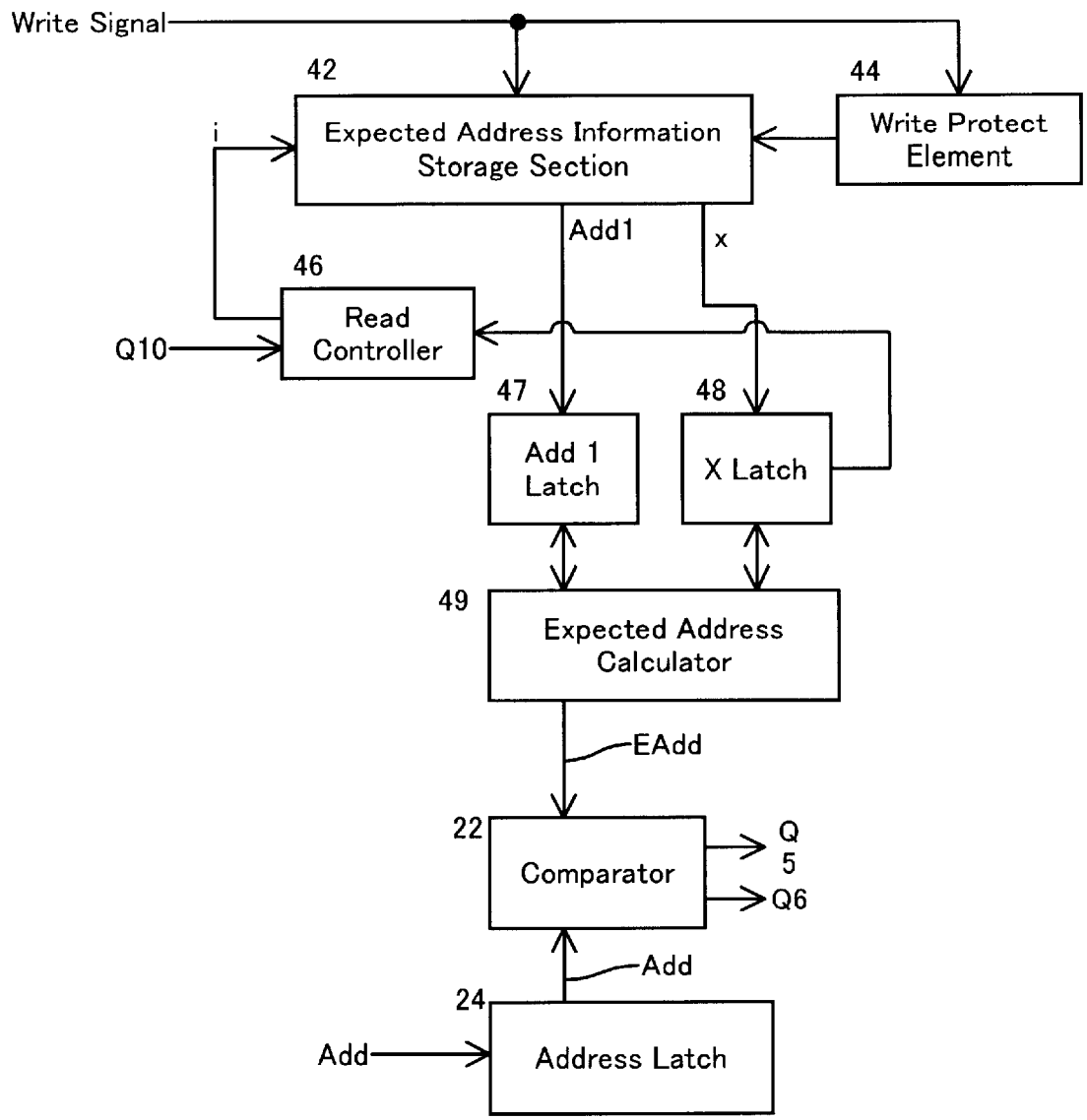
FIG. 9 is a diagram exemplifying the structure of an expected-address generating section 40.

FIG. 9 exemplifies the structure of the expected-address generating section 40. The example of FIG. 9 has an expected-address information storage section 42 having an expected-address information region where expected address information is stored and a write-protecting element 44 for write-protecting this storage section 42. The expected address information as shown in FIG. 8A is written in the expected-address information storage section 42 by a predetermined write signal, after which the storage section 42 is write-protected by the write-protecting element 44. There is no circuit provided which allows the information in the expected-address information storage section 42 to be externally read out.

The expected-address generating section 40 further comprises a read control section 46 which supplies the address i to the expected-address information storage section 42, an Add1 holding section 47 which holds the start address value Add1 in the expected address information, an x holding section 48 which holds the continuous value x and an expected-address calculation section 49 which calculates the expected address EAdd based on the values held in the holding sections 47 and 48.

In response to a control signal Q10 from the command decoder 20, the read control section 46 initializes the address i to 0 and reads the start address value Add1 for the area of address i and the continuous value x from the expected-address information storage section 42. The x holding section 48 decrements the continuous value x and instructs the read control section 46 to increment the address i when the continuous value x becomes 0.

The expected-address calculation section 49 generates the expected address EAdd by incrementing the start address value Add1 as the start address by the continuous value x, held in the x holding section 48, and sends the expected address EAdd to the comparator 22. The comparator 22 compares the input address Add with the expected address EAdd and outputs the break signal Q5 or Q6 when both addresses do not coincide with each other.

As the comparator 22 has only to compare the input address Add with the associated expected addresses EAdd one at a time in the second embodiment, this embodiment can require fewer comparison operations than the first embodiment.

Figure 10:
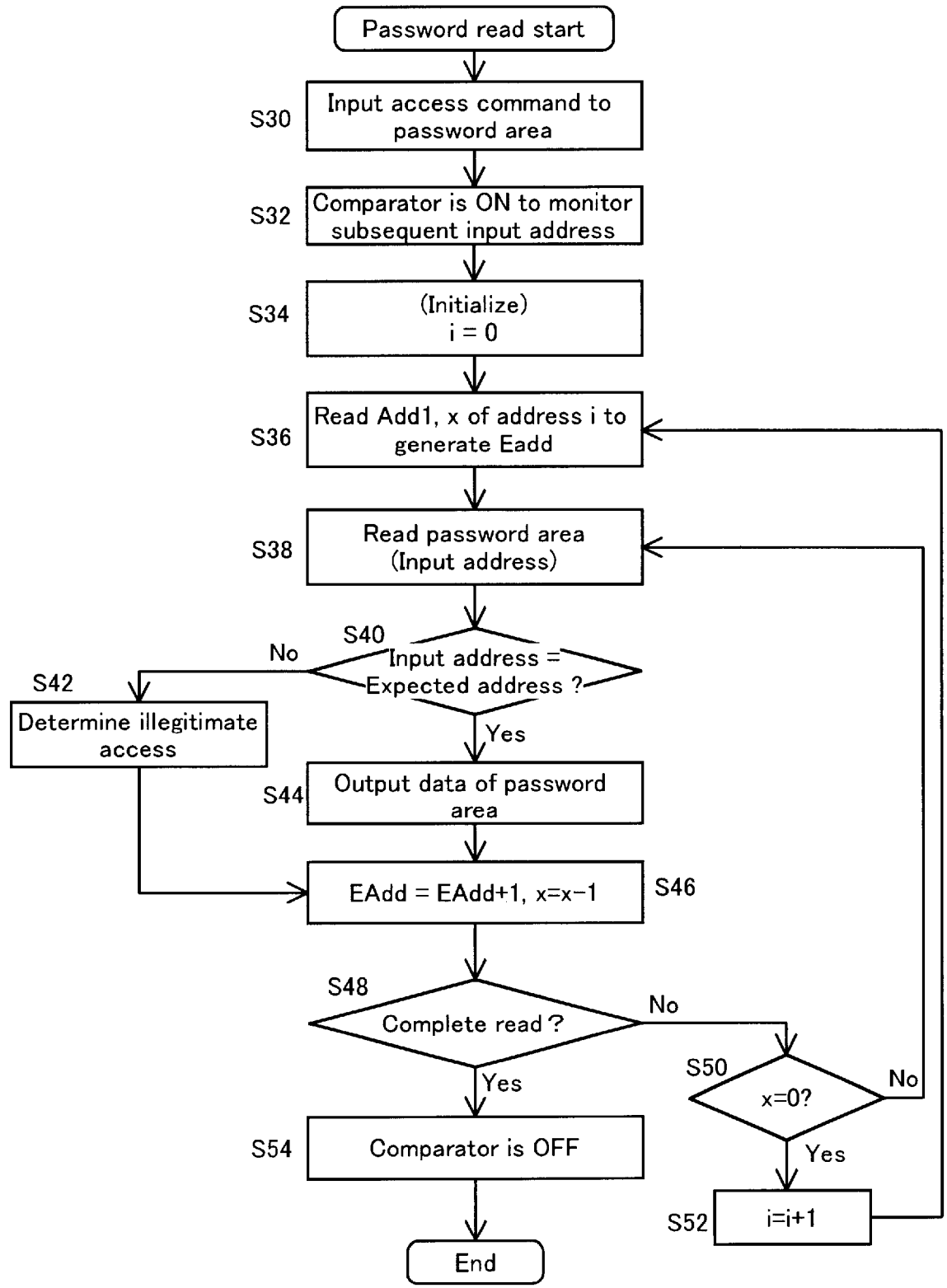
FIG. 10 is a flowchart illustrating a password reading operation according to the second embodiment.

FIG. 10 is a flowchart illustrating the password reading operation according to the second embodiment. If the command decoder is constructed by a microprocessor, a program which carries out the individual processes in this flowchart is stored in and run by the command decoder.

Prior to the password reading operation, a person who manufactures portable telephones, IC cards or the like using the flash memory writes expected address information in the expected-address information storage section 42 and then write-protects the storage section 42 by means of the write-protecting element 44. Then, the expected address information or a sequence of addresses that are computed from the expected address information are recorded in the external CPU that attempts to access this flash memory 1. There is no circuit provided which allows the expected address information or expected addresses to be externally read out.

To read data from the main memory area 3 in the flash memory 1, the CPU first input an access command (or read command) to the password area 2 (S30). When the command decoder 20 decodes the access command and detects that the command requests a read access to the password area 2, the command decoder 20 activates the comparator 22 using the control signal Q2 (S32). This enables the comparator 22 to monitor a subsequently input address.

The command decoder 20 initializes the expected-address generating section 40 by the control signal Q10, sets the initial address i=0 in the expected-address information storage section 42 and requests the generation of the expected address (S34). Then, the read control section 46 reads the expected address information, the start address Add1 and the continuous value x stored at the address i in the expected-address information storage section 42. Based on those information, the expected-address calculation section 49 generates the expected address EAdd (S36).

Then, an address is input and latched in the address holding section 24 to read the password area 2 (S38). The comparator 22 compares the input address with the generated expected address EAdd to check if there is a match (S40). When there is a match, the comparator 22 permits readout of the data in the password area 2 associated with the input address (S44). If there is no match, the comparator 22 determines that illegitimate access is being made, and generates the break signal Q5 or Q6 (S42). The data inversion and the destruction of the password data in response to the break signals are the same as those of the first embodiment.

Next, if matched the expected-address calculation section 49 increments the expected address EAdd and decrements the value x in the x holding section 48 (S46). If reading the password area 2 has not been completed yet (S48), the above-described steps S38 to S44 are repeated until the continuous value x becomes 0 (S50). When the continuous value x becomes 0, the x holding section 48 informs the read control section 46 of that event and the read control section 46 increments the address i (S52), and reads the next expected address information (S36). The above sequence of processes is repeated until reading the password area 2 is completed.

When the information in the password area 2 is properly read and the CPU carries out the password-based authentication, the CPU sends an access command to the main memory area 3. As a result, the command decoder 20 deactivates the comparator 22 (S54), thus terminating the password-area reading operation. Thereafter, information is read from the main memory area 3 in accordance with the input address.

According to this embodiment, as discussed above, reading the password itself is made difficult by accessing the password area in a nonvolatile memory, which prevents illegitimate copy using password-based authentication, by a set sequence of addresses or a set address order. Information about the sequence of addresses or the address order is designed as externally unreadable.

In the second embodiment, it is possible to make reading the password area harder by writing the expected address in an area which is externally unreadable and is write-protected.

As apparent from the above, this invention can make it difficult to read the password area in the nonvolatile memory which prevents illegitimate copy using password-based authentication, thus ensuring stronger protection against illegitimate use of the nonvolatile memory through illegitimate information copy.

It should be apparent to those skilled in the art that the present invention is not limited to the details of the above-described embodiments, but is intended to embrace all alternatives, modifications and variances which fall within the scope of the appended claims.

What is claimed is:

1. A nonvolatile memory comprising;

a main memory area for storing a predetermined data; and a password area where an authentication password for granting access to said main memory area is recorded said password area including a trap area where said authentication password is not recorded, wherein said authentication password is read out from the password area and the predetermined data in the main memory area is read out after an authentication employing said authentication password, wherein when access to said trap area is made at a time of accessing said password area, reading of information from said password area is inhibited.

2. The nonvolatile memory according to claim 1, further comprising: a trap address area where a trap address of the trap area is recorded, and is externally unrewritable and unreadable; and a comparison section for comparing a supplied address with said trap address recorded in said trap address area so as to inhibit reading of information from said password area when both addresses coincide with each other.

3. The nonvolatile memory according to claim 1, wherein inhibition of reading of information from said password area is accomplished by inverting data to be output from said password area.

4. The nonvolatile memory according to claim 1, wherein inhibition of reading of information from said password area is accomplished by destroying said information in said password area.

* * * * *